(12) United States Patent
Alexeyev (10) Patent No.: US 10,794,971 B2
(45) Date of Patent: Oct. 6, 2020

(54) DUTY-CYCLE CONTROL FOR POWER-LEVEL ADJUSTMENT IN SWITCH-MODE POWER AMPLIFIERS

(71) Applicant: Alexander Alexeyev, Beverly, MA (US)

(72) Inventor: Alexander Alexeyev, Beverly, MA (US)

(73) Assignee: WaveGuide Corporation, Cambridge, MA (US)

( * ) Notice: Subject to any disclaimer, the term of this patent is extended or adjusted under 35 U.S.C. 154(b) by 0 days.

(21) Appl. No.: 15/935,831

(22) Filed: Mar. 26, 2018

(65) Prior Publication Data

US 2018/0275229 A1    Sep. 27, 2018

Related U.S. Application Data

(60) Provisional application No. 62/477,014, filed on Mar. 27, 2017.

(51) Int. Cl.
  *G01R 33/36*    (2006.01)
  *G01R 33/30*    (2006.01)

(52) U.S. Cl.
  CPC ....... *G01R 33/3614* (2013.01); *G01R 33/302* (2013.01); *G01R 33/3607* (2013.01); *G01R 33/3621* (2013.01); *G01R 33/3628* (2013.01)

(58) Field of Classification Search
  CPC .............. G01R 33/3614; G01R 33/302; G01R 33/3621; G01R 33/362
  See application file for complete search history.

(56) References Cited

U.S. PATENT DOCUMENTS

| 6,087,853 A * | 7/2000 | Huber ................ H03K 19/0005 |
|  |  | 326/83 |
| 6,683,494 B2 * | 1/2004 | Stanley ................ H03F 3/2175 |
|  |  | 330/10 |

(Continued)

FOREIGN PATENT DOCUMENTS

| WO | 2006107815 A2 | 10/2006 |
| WO | 2008105592 A1 | 9/2008 |

OTHER PUBLICATIONS

International Search Report and Written Opinion for International Application No. PCT/US2018/024333 dated Jul. 26, 2018 13 pages.

*Primary Examiner* — Dominic E Hawkins
(74) *Attorney, Agent, or Firm* — Morgan, Lewis & Bockius LLP (57) ABSTRACT

An approach for accurately setting a duty cycle of PA switching waveforms uses an all-digital PVT sensor circuit. In various embodiments, the all-digital PVT sensor circuit measures a pulse width of a periodic reference signal using digital delay line, and subsequently, implements an off-chip digital calculation to program the digital delay line to delay this periodic reference signal so that, when the delayed periodic reference signal is combined with the original (undelayed) reference via a logical AND operation, the resulting signal conforms to a desired duty cycle. In one implementation, the PA is a class-D PA, which may have a single-ended configuration or a differential configuration having two single-ended structures operating in opposite phases.

26 Claims, 6 Drawing Sheets

(56) References Cited

U.S. PATENT DOCUMENTS

| | | | | |
|---|---|---|---|---|
| 8,487,680 B1* | 7/2013 | Chung | ................ | H03K 5/1565 |
| | | | | 327/172 |
| 2002/0180547 A1* | 12/2002 | Staszewski | ............... | H03F 1/02 |
| | | | | 332/115 |
| 2006/0214688 A1 | 9/2006 | Pan et al. | | |
| 2008/0267280 A1* | 10/2008 | Yousif | .................. | G04F 10/005 |
| | | | | 375/239 |
| 2011/0057654 A1* | 3/2011 | Sun | .................... | G01R 33/3628 |
| | | | | 324/318 |
| 2013/0342207 A1* | 12/2013 | Keupp | ............... | G01R 33/3614 |
| | | | | 324/309 |
| 2014/0176135 A1 | 6/2014 | Griswold et al. | | |
| 2014/0367270 A1* | 12/2014 | Williamson | ............ | C25B 15/02 |
| | | | | 205/337 |
| 2018/0109411 A1* | 4/2018 | Sen | .................... | G01R 33/3607 |

\* cited by examiner

DC = Tper/Tpw

DUTY-CYCLE CONTROL FOR
POWER-LEVEL ADJUSTMENT IN
SWITCH-MODE POWER AMPLIFIERS

CROSS-REFERENCE TO RELATED
APPLICATION

This application claims priority to and the benefit of, and incorporates herein by reference in its entirety, U.S. Provisional Patent Application No. 62/477,014, filed on Mar. 27, 2017.

FIELD OF THE INVENTION

The field of the invention relates, generally, to nuclear magnetic resonance (NMR) equipment, and in particular to managing power levels in such equipment.

BACKGROUND

Nuclear magnetic resonance (NMR) is a well-known analytic technique that has been used in a number of fields, such as spectroscopy, bio-sensing and medical imaging. In general, an NMR device includes transceiver circuits to transmit signals to a test sample and receive echo signals therefrom. For example, with reference to FIG. 1, the basic components a conventional NMR system 100 include an NMR coil 102 surrounding a sample 104 being analyzed, a magnet 106 for generating a static magnetic field $B_0$ across the sample 104 and the coil 102, a duplexer 108 coupled to the NMR coil 102, and a controller 110 for controlling operation of the various components. Typically, the duplexer 108 includes a transmitter (Tx) portion for delivering RF signals to the NMR coil 102 and a receiver (Rx) portion for receiving echo signals from the sample 104 vis the NMR coil 102.

Figure 1:
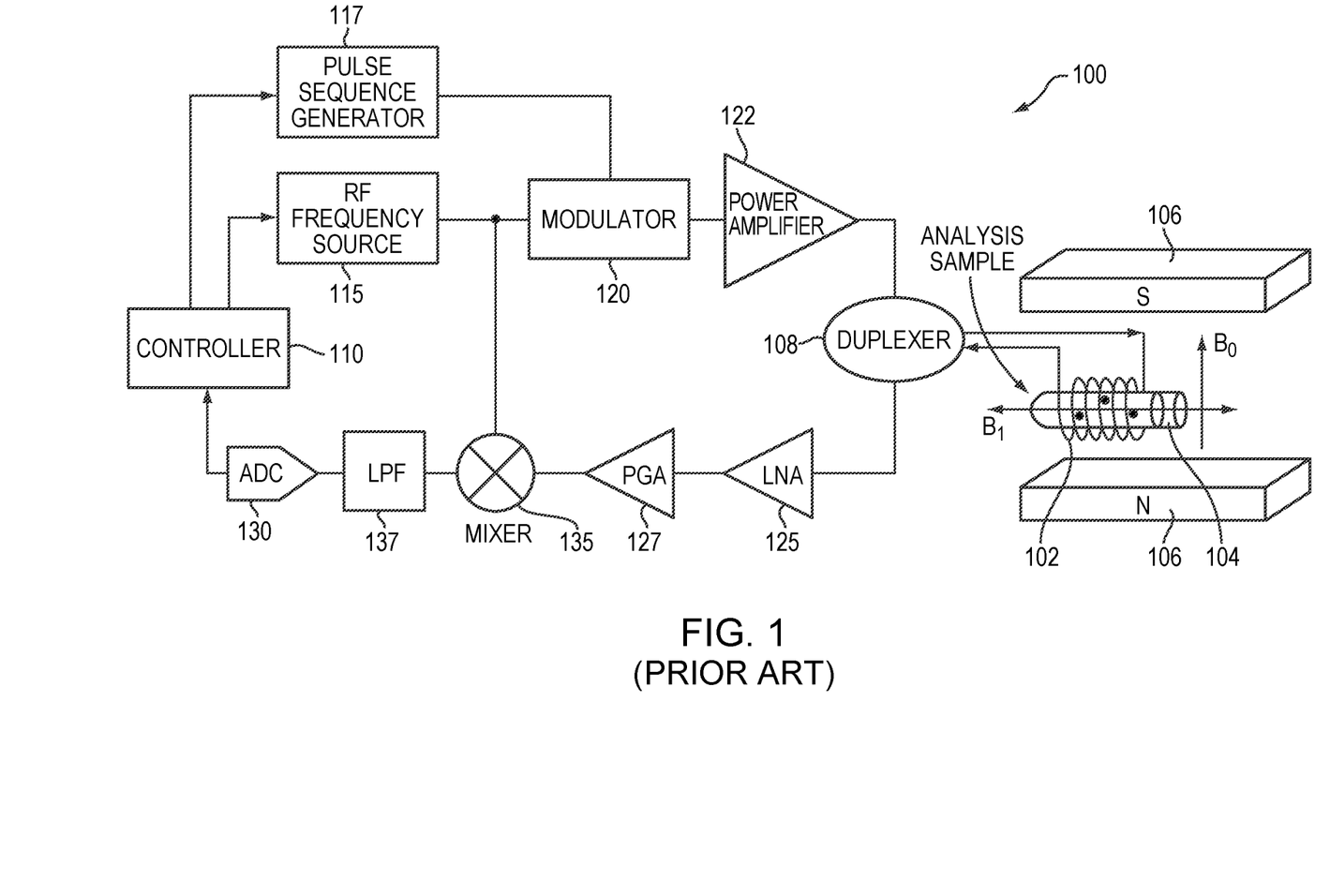
FIG. 1 schematically illustrates a conventional NMR device.

NMR coil 102 and transceiver 108 are commonly known as an "NMR probe," which operates with large electromagnets or superconducting permanent magnets in conventional NMR systems. The NMR probe is typically included in an environment having a 50Ω impedance because of a long interconnection required between the probe and NMR instrument.

The RF signals delivered by the duplexer 108 originate with an RF frequency source 115 and a pulse sequence generator 117. A modulator circuit 120 modulates the RF signal from the RF frequency source 115 in accordance with the pulse sequence supplied by the pulse sequence generator 117. The modulated RF signal is amplified by a power amplifier 122.

During NMR measurements, the modulated RF signal having a Larmor frequency $\omega_0$ is delivered to the coil 102 via the duplexer 108; the coil 102 generates an RF magnetic field $B_1$ (which is typically orthogonal to the static magnetic field $B_0$) that resonantly excites nuclei spins within the sample 104. After a time duration, $\Delta t$, the RF excitation signal is stopped and the controller 110 causes the duplexer 108 to receive the echo signals from the sample 104. Upon stopping the RF excitation, the nuclear spins within the sample 104 precess around the $B_0$-axis at the Larmor frequency $\omega_0$. The nuclear spins slowly lose phase coherence via spin-spin interactions, which manifest themselves in a macroscopic average as an exponential relaxation or damping signal in the precession of the net magnetic moment. This NMR signal relaxation can be detected by the coil 102. Because the spin-spin interactions are peculiar to the material of the sample 104 being tested, the characteristic time, commonly referred to as $T_2$, of the relaxation signal is material specific.

The duplexer 108 directs the received echo signals, representing the signal output of the NMR probe, to an amplification block including a pre-amplifier (e.g., a low-noise amplifier 125) and a programmable gain amplifier 127. The signal is ultimately converted to digital form by an analog-to-digital converter (ADC) 130 for processing. But the frequency of the "raw" NMR signal received by the pre-amplifier 125 is too high for the ADC 130, and is therefore "down-converted" through comparison with the signal supplied by the RF frequency source 115. A mixer 135 combines the amplified NMR signal, which oscillates at the Larmor frequency, with the reference signal from the RF frequency source to generate a new signal that oscillates at a lower "relative Larmor frequency." Following filtering by a low-pass filter 137, the signal varies slowly enough to be handled by the ADC 130 but nonetheless retains the essential frequency characteristics of the received echo signals.

Thus, by measuring the Larmor frequency $\omega_0$ described above (e.g., for spectroscopy) and characteristic time $T_2$ (e.g., for relaxometry), NMR techniques can be used as an analytic tool in a number of fields, including but not limited to chemical composition analysis, medical imaging, and bio-sensing.

Significant efforts have been devoted to miniaturizing traditional NMR systems. For example, the entire NMR electronics, including the power amplifier (PA) 122, may be integrated on a single semiconductor device. The numerous advantages of miniaturization include low cost, portability, and the fact that a micro-coil tightly surrounding a small sample increases the signal quality. In addition, reducing the size of the magnet 106 allows use of a much smaller power to excite (or polarize) the sample 104 than in a conventional system.

Figure 2A:
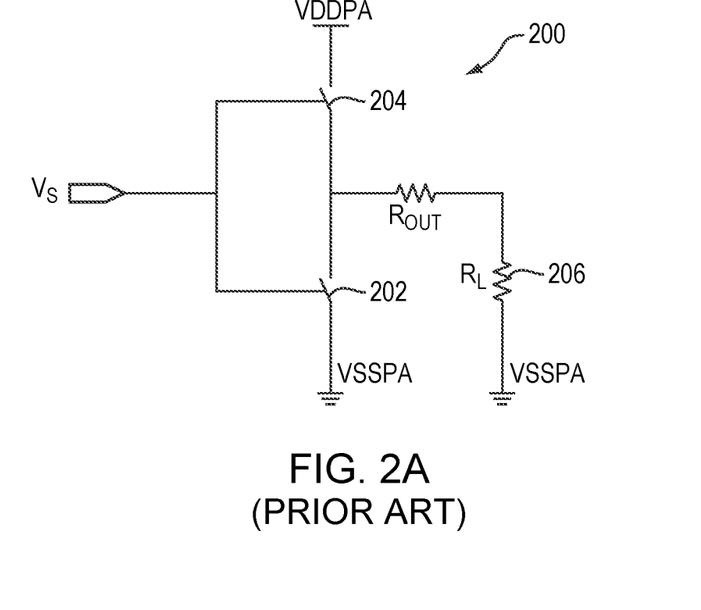
FIG. 2A schematically illustrates a conventional class-D power amplifier.

FIG. 2A depicts a traditional class-D PA 200 implemented in a miniaturized NMR system; the input signal $V_S$ to the PA 200 is typically a square-wave signal having low and high amplitudes between the ground ($V_{SSPA}$) and the PA source voltage ($V_{DDPA}$). The input signal is used to close and open switches 202, 204 in an alternating fashion for connecting an output load 206 to either $V_{DDPA}$ or $V_{SSPA}$. The power transferred to the load 206 depends on the output impedance of the amplifier 200, the input signal amplitude $V_S$, and the load impedance $R_L$. In a single-ended PA as depicted in FIG. 2, the delivered power can be represented as:

$$P_L = \frac{1}{2} \frac{|V_S|^2 R_L}{(R_{Out} + R_L)^2}. \qquad \text{Eq. (1)}$$

When the duty cycle of the input switching bipolar square-wave signal is not 50%, the total average power at the fundamental frequency supplied by the PA can be computed as:

$$P_{Av} \cong \frac{\left(\frac{4}{\pi} \times V_{DDPA} \times \sin(\pi \times DUTYCYCLE)\right)^2}{2 \times (2R_{OUT} + R_L)}. \qquad \text{Eq. (2)}$$

where DUTYCYCLE is the positive duty cycle of the waveform expressed as a decimal fraction in the range from 0 to 0.5. Thus, the total average power is a direct function of the supply voltage $V_{DDP4}$, the duty cycle of the input square-wave signals, the output impedance of the PA, and the impedance of the load $R_L$.

The traditional class-D PA typically delivers a power ranging from watts to kilowatts. The power may be adjusted by changing the supply voltage $V_{DDP4}$ while maintaining the duty cycle of the switching waveform at 50% (DUTY-CYCLE=0.5) corresponding to the maximum total average power of the fundamental. In addition, the output impedance $R_{OUT}$ and load impedance $R_L$ are generally kept constant so as to ensure impedance matching between the PA and the load resistor 206.

Recent developments in class-D amplifier technology have been exploited to integrate the PA on a semiconductor device and generate excitation signals suitable for NMR measurements, particularly in low-field time-domain NMR relaxometry. Controlling the available power of the integrated class-D PA via adjustment of the supply voltage, $V_{DDP4}$, however, is not desirable. This is because such adjustment ordinarily requires implementation of an additional power domain and associated pin(s) dedicated exclusively to the PA output drivers; this introduces extra system complexity.

Figure 2B:
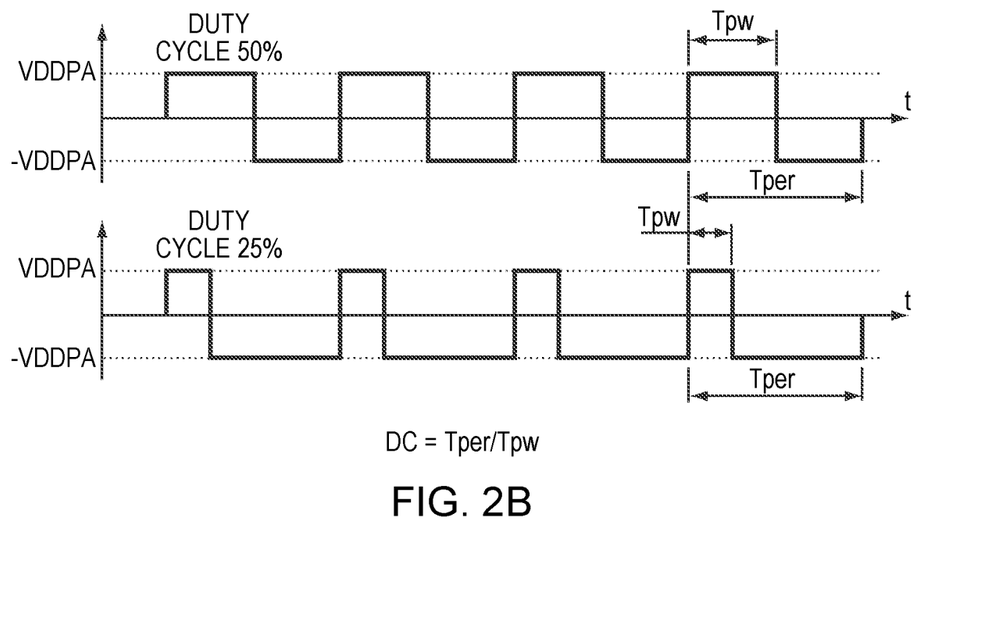
FIG. 2B is a timing diagram illustrating the definition of duty cycle.

Alternatively, the total available power may be adjusted via changing the duty cycle of the PA switching waveform as shown in FIG. 2B and Eq. (2). In this case a duty cycle control block is inserted between RF signal source 115 and modulator 120 in FIG. 1

Efforts have been made to use analog duty-cycle-control circuits to adjust the duty cycle of the input signals to an integrated PA. Conventional approaches, however, tend to suffer from a high degree of variability and poor control of accuracy when environmental conditions, such as a manufacturing process, supply voltage and operating temperature (PVT) vary. Accordingly, there is a need for an approach that reliably and accurately controls the total available power of the PA by adjusting the duty cycle of the switching input signals. The approach should desirably account for effects resulting from various environmental conditions (e.g., PVT), thereby ensuring repeatably stable power levels during NMR measurements.

SUMMARY

Embodiments of the present invention provide an approach for accurately setting a duty cycle of PA switching waveforms using an all-digital PVT sensor circuit. In various embodiments, the all-digital PVT sensor circuit measures a pulse width of a periodic reference signal using digital delay line, and subsequently, implements an off-chip digital calculation to program the digital delay line to delay this periodic reference signal so that, when the delayed periodic reference signal is combined with the original (undelayed) reference via a logical AND operation, the resulting signal conforms to a desired duty cycle. In one implementation, the PA is a class-D PA, which may have a single-ended configuration or a differential configuration having two single-ended structures operating in opposite phases.

Accordingly, in a first aspect, the invention relates to circuitry for adjusting a duty cycle of an RF carrier input signal to a PA. In various embodiments, the circuitry comprises a digital delay line, comprising a plurality of digital delay elements, for receiving the input signal; a time-to-digital converter for measuring a number of the digital delay elements required for generating a desired duty cycle; and circuitry for selecting the number of delay elements of the digital delay line required to generate a desired duty cycle and receiving an output signal therefrom, the output signal having the adjusted duty cycle. In some embodiments, the circuit further comprises a processor having a control register for enabling a HIGH-power mode or a LOW-power mode of the circuitry. For example, the control register may have a value of 1 for enabling the LOW-power mode and a value of 0 for enabling the HIGH-power mode. The control register may select the HIGH-power mode when the desired duty cycle has a value between 25% and 50% and the LOW-power mode when the desired duty cycle has a value between 5% and 25%.

In various embodiments, the circuitry further comprises a processor having a register for bypassing the digital delay line. The digital delay line may comprise a plurality of delay elements. Each one of the delay elements may comprise one input and three outputs. For example, a first one of the outputs may be coupled to an input of a successive delay element; a second one of the outputs to an input of a multiplexer; and a third one of the outputs to an input of the time-to-digital converter.

In some embodiments, the circuitry further comprises a processor configured to determine the number of the delay elements required for generating the desired duty cycle based on a measurement of the time-to-digital converter. The processor may be implemented on a chip integrating the digital delay line and time-to-digital converter, or off a chip integrating the digital delay line and time-to-digital converter; in the latter case, the circuitry may further comprise a communication module for allowing signal communication between the processor and the chip.

In another aspect, the invention pertains to an NMR apparatus comprising an NMR coil configured to enclose a sample; an integrated switch-mode PA coupled to the NMR coil; and circuitry for adjusting a duty cycle of an input signal to a power amplifier (PA). In various embodiments, the circuitry includes (i) a digital delay line having a plurality of delay elements, and (ii) a time-to-digital converter for measuring a number of the delay elements required for generating a desired duty cycle. The circuitry may include one or more of the features described above.

In general, as used herein, the term "substantially" means ±10%, and in some embodiments, ±5%. In addition, reference throughout this specification to "one example," "an example," "one embodiment," or "an embodiment" means that a particular feature, structure, or characteristic described in connection with the example is included in at least one example of the present technology. Thus, the occurrences of the phrases "in one example," "in an example," "one embodiment," or "an embodiment" in various places throughout this specification are not necessarily all referring to the same example. Furthermore, the particular features, structures, routines, steps, or characteristics may be combined in any suitable manner in one or more examples of the technology. The headings provided herein are for convenience only and are not intended to limit or interpret the scope or meaning of the claimed technology.

BRIEF DESCRIPTION OF THE DRAWINGS

In the drawings, like reference characters generally refer to the same parts throughout the different views. Also, the drawings are not necessarily to scale, with an emphasis instead generally being placed upon illustrating the principles of the invention. In the following description, various embodiments of the present invention are described with reference to the following drawings, in which.

DETAILED DESCRIPTION

Figure 3A:
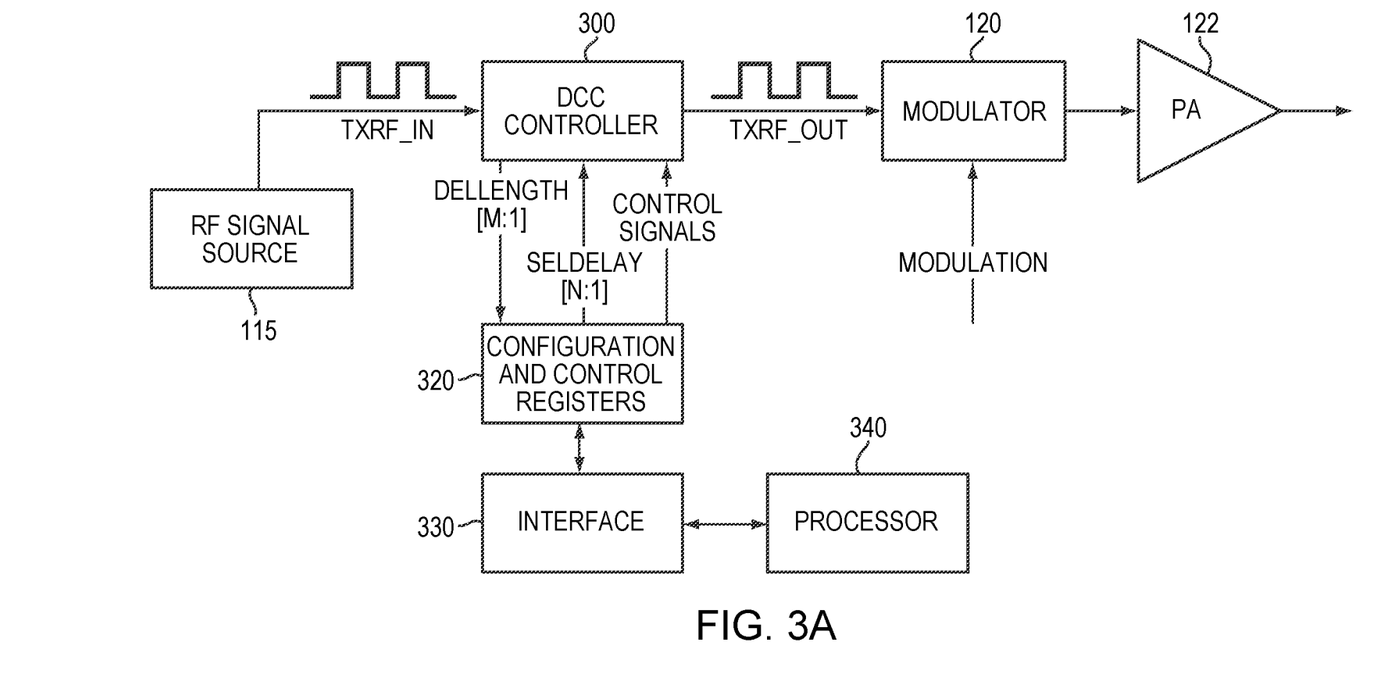
FIG. 3A schematically illustrates the relationship between the duty-cycle controller shown in FIG. 3B and other components of an NMR system.
Figure 3B:
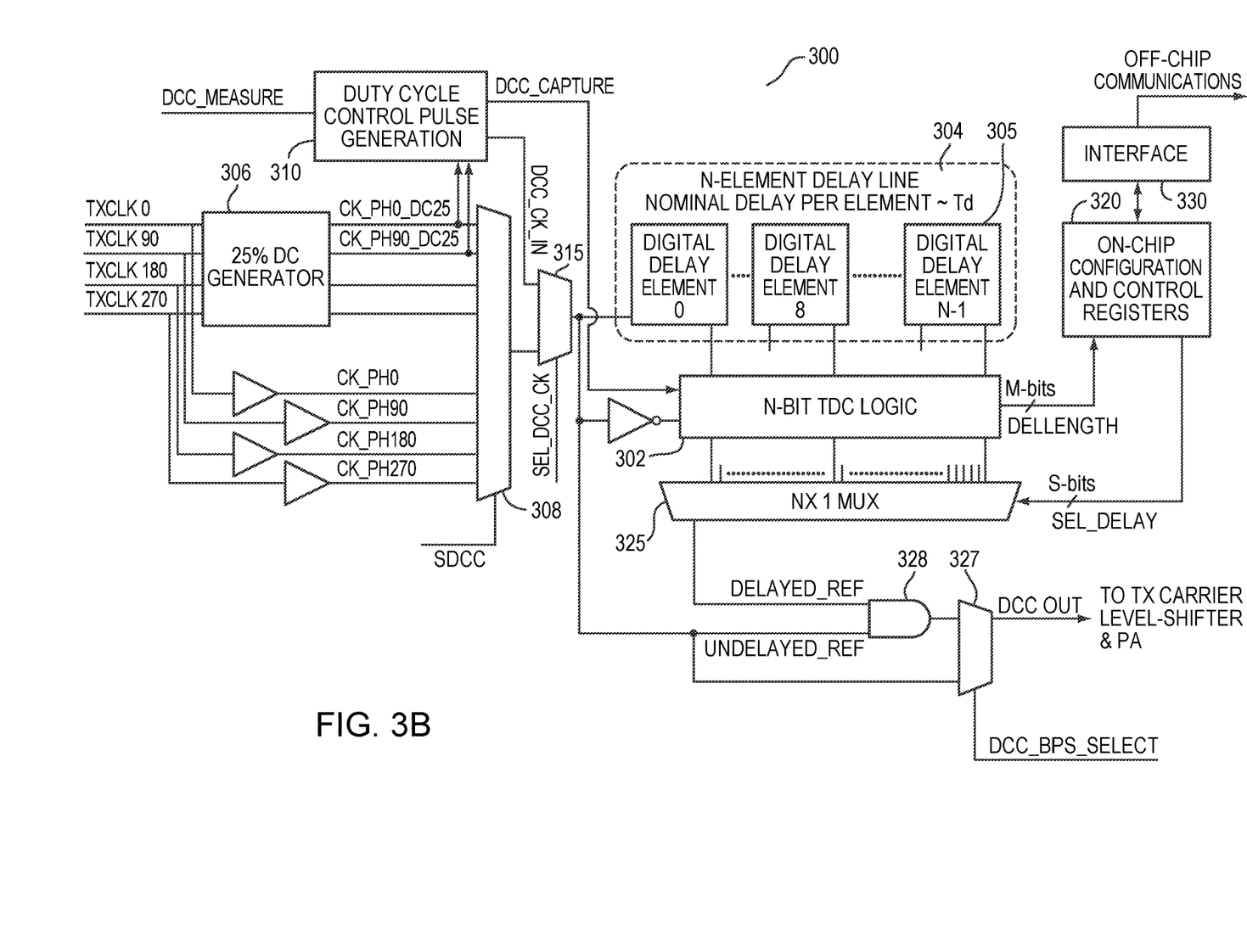
FIG. 3B schematically illustrates an exemplary circuit for duty-cycle control.

FIG. 3B depicts exemplary duty-cycle-control (DCC) circuitry 300 in accordance with various embodiments of the present invention. The DCC circuitry 300 includes two main components: a time-to-digital converter logic (TDC LOGIC) block 302 and a digital delay line (DDL) 304. Together, block 302 and DDL 304 form a time-to-digital converter (TDC). DDL 304 includes N digital-delay elements 305 connected in series, where the output of each delay element is connected to the input of the next delay element and is also connected to one of the inputs of the TDC LOGIC block 302. The total number of delay elements N and the delay Td through each individual delay element 305 of the DDL are chosen to ensure that under all PVT conditions, DDL will provide an accurate measurement of ¼ of the TX carrier period (in units of Td) with the resolution required for a desired accuracy of duty-cycle programming. The TDC is a sensor that measures the number of delay elements 305 in the DDL 304 required to delay the rising edge of the input TX carrier signal TXRF_IN with a 50% duty cycle by ¼ of the period of the TX carrier signal (which corresponds to the output of the RF frequency source 115 shown in FIG. 1 and labeled TXRF_IN in FIG. 3A).

This number of delay elements, designated as DNUMTXCK, represents the measurement of ¼ of the TX_carrier period in units of Td and is used to compute the required number of delay-line elements 305 for generating a DCC_OUT (indicated as TXRF_OUT signal in FIG. 3A) signal with a specific duty cycle as a fraction of DNUMTXCK. This signal is provided to the modulator 120 as the duty-cycle-controlled RF frequency source. The value of DNUMTXCK is always less than or equal to the total number of delay elements N.

Figure 3C:
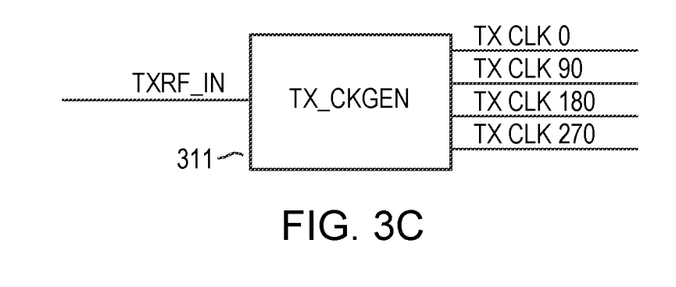
FIG. 3C schematically illustrates generation of quadrature phase inputs to the duty-cycle controller shown in FIG. 3B.
Figure 4:
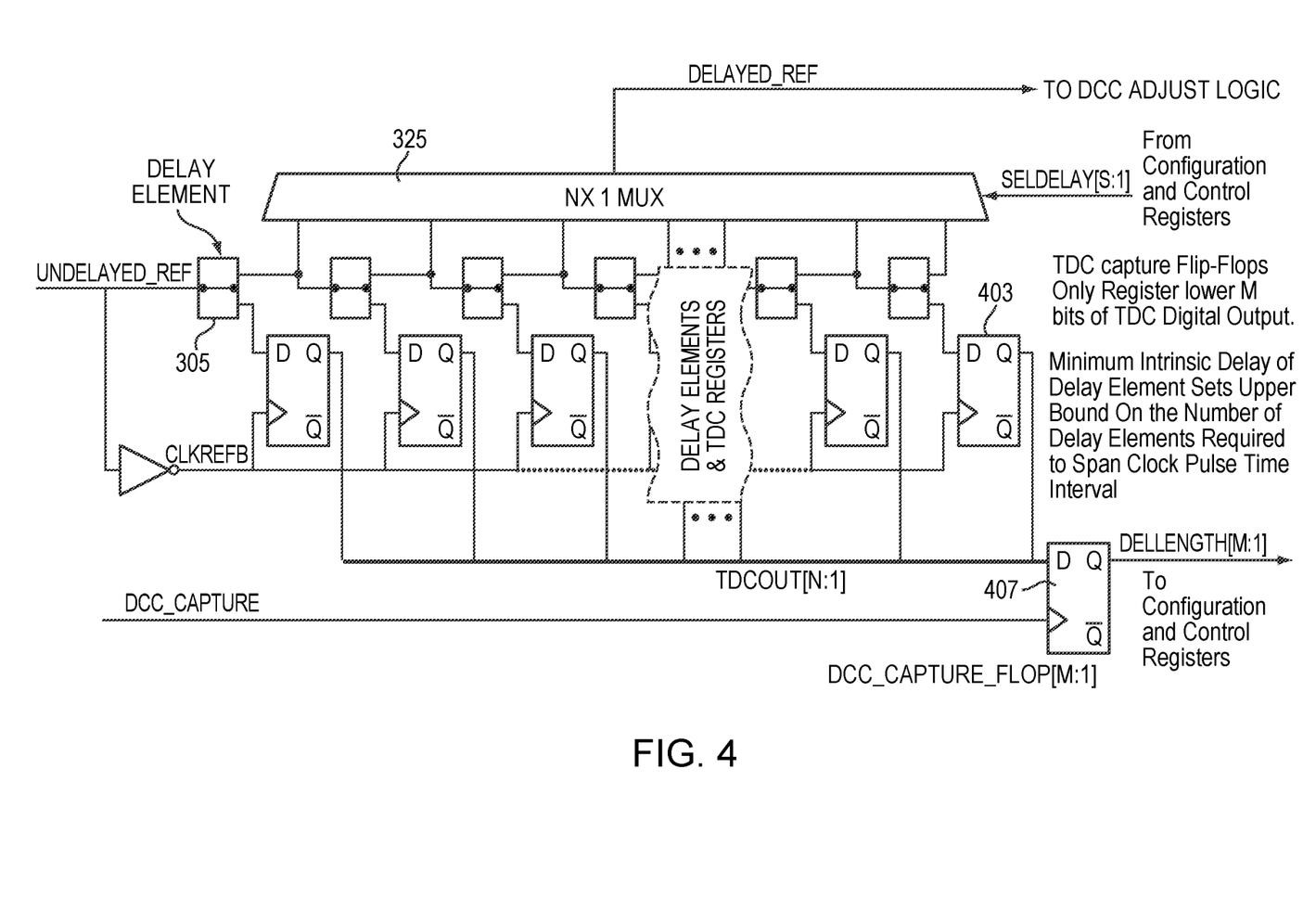
FIG. 4 schematically illustrates, in greater detail, a time-to-digital converter in accordance with embodiments of the invention.
Figure 5:
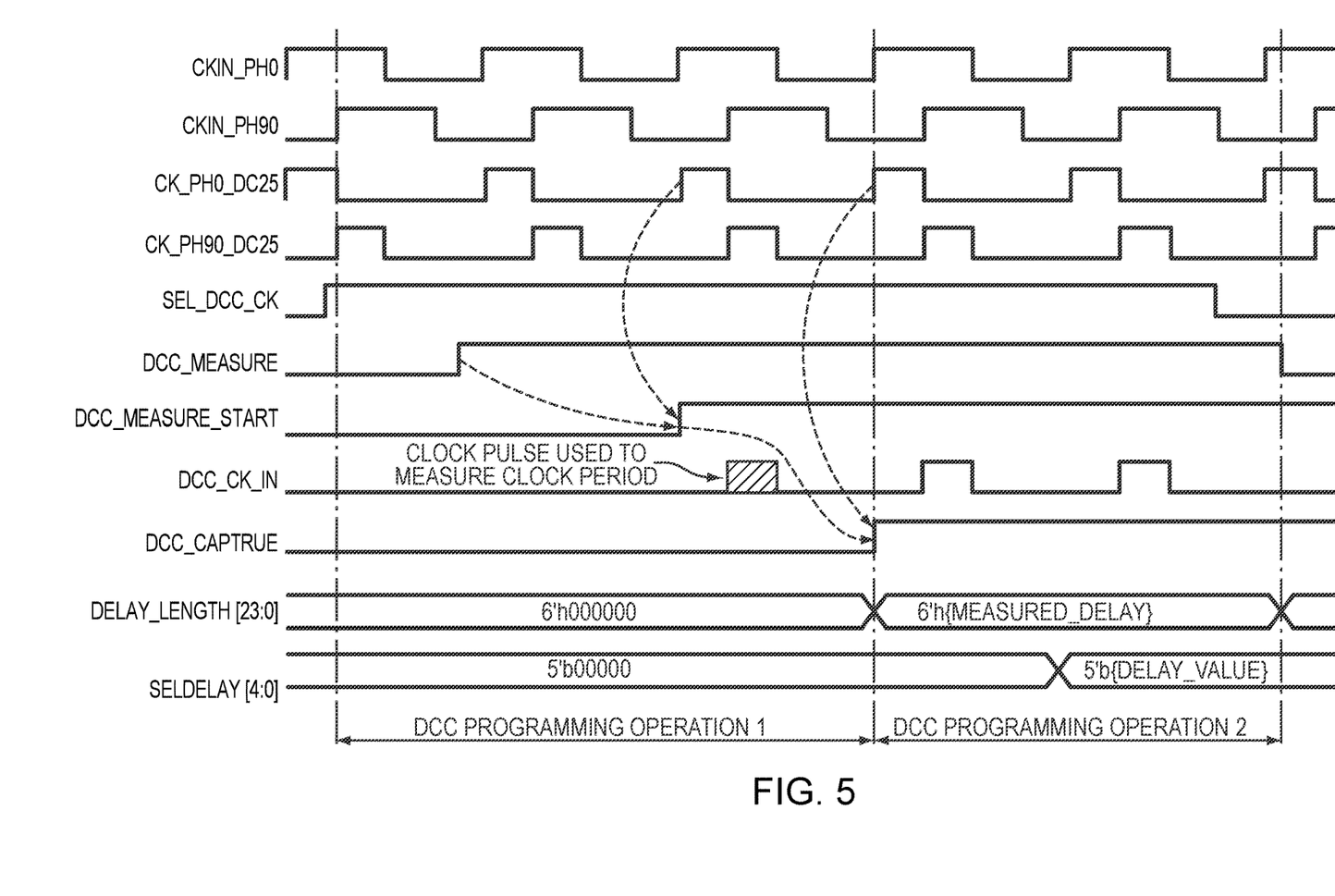
FIG. 5 is a timing diagram.

With reference to FIGS. 3A-3C, and 4, programming the duty cycle of the DCC_OUT signal involves two sequential operations as shown in FIG. 5. First, the TDC circuit comprising the DDL 304 and the TDC LOGIC block 302 measures the TX_carrier period, expressed as the closest integer number DNUMTXCK, of the delays Td required to span exactly ¼ of the TX carrier clock period. And second, the target duty cycle of DCC_OUT is programmed by selecting the required number of delays Td—i.e., DNUM-DCC—in the DDL 304 to represent the desired duty cycle of the signal DCC_OUT after the delayed signal DELAYED_REF is combined with signal UNDE-LAYED_REF via a logical AND operation as shown in FIG. 3B.

In various embodiments, in order to reduce the length of the DDL 304 and the TDC LOGIC block 302 required to measure the period of the TX carrier signal, the DCC circuitry 300 uses an input clock pulse having a duration of exactly ¼ of the period of TXRF_IN. This clock pulse corresponds to a 25% duty cycle of the TXRF_IN signal and can be generated by performing logic operations on the quadrature phases of the input clock TXRF_IN. In particular, quadrature components TX_CLK0, TX_CLK90, TX_CLK180 and TX_CLK270 of the clock signal TXRF_IN are generated by block TX_CKGEN (as shown in FIG. 3C) placed at the output of the RF frequency source 115. The quadrature components TX_CK0, TX_CK90, TX_CK180 and TX_CK270 are then provided to a 25% duty cycle generator (DCG) 306 that generates 25% duty cycle waveforms of the quadrature phases of the input signal TXRF_IN. Multiplexer 308 is then used to select between the quadrature phases of TXRF_IN that have a 50% and a 25% duty cycle.

The DCC circuitry 300 may have a HIGH-power mode and a LOW-power mode corresponding to the 50% and 25% duty cycle of the output signal DCC_OUT. These modes are accessible via an internal configuration and/or control registers 320. Specifically, when an internal register corresponding to the multiplexer 308 select signal SDCC is written HI, a low-power mode is enabled by selecting one of the quadrature components of the signal TXRF_IN with the 25% duty cycle to propagate through to the input of the modulator 120. Alternatively, when signal SDCC is driven LOW, one of the 50% duty cycle quadrature components of signal RF_CLKIN will propagate to the input of the modulator 120.

A second multiplexer 315 is employed during the first operation of the duty cycle programming. It is used to select a single 25% duty cycle clock pulse of the RF_CLKIN signal with quadrature phase 90 degrees to perform TDC measurement. The signals and sequence of logic operations during the first operation (TDC measurement) are shown in FIG. 5. Prior to the TDC measurement signals SEL_DC-C_CK, DCC_MEASURE, DCC_MEASURE_START, DCC_CK_IN, DCC_CAPTURE—also labeled CONTROL SIGNALS in FIG. 3A—are driven LOW by resetting all associated configuration registers that are used to control these signals via a digital interface. To initiate TDC measurement signal SEL_DCC_CK is driven HIGH by writing to the associated control register to select DCC_CKIN input of the multiplexer 315 to propagate to the DDL 304 and TDC LOGIC 302. When the signal DCC_MEASURE is asserted HIGH by writing corresponding internal register, duty cycle control/pulse generation block 310 drives HIGH the signal DCC_MEASURE_START on the second detected rising edge of the signal CK_PH0_DC25. The rising edge of the signal DCC_MEASURE_START then enables propagation of the signal CK_PH0_DC25 to the output DCC_CK_IN of the block 310 to the DLL 304 and TDC LOGIC BLOCK 302. Consequently, the DCC_CAPTRUE signal is driven HIGH on the third detected rising edge of the signal CK_PH0_DC25 to capture TDC measurement results, TDCOUT, in capture registers 407 (see FIG. 4) as a digital word DELLENGTH of length M bits, where M is equal or less than the length N of the DDL. At this point, the signal SEL_DCC_CK is driven LOW by writing the corresponding control register in block 320. This disables DCC pulse generation block 310 and completes first operation in the DCC programming sequence. It should be noted that the timing between steps in the sequence of operations may not be critical and thus may be set based on application requirements.

The signal DELLENGTH is a temperature-encoded measurement of exactly ¼ of the TXRF_IN carrier period with the number of non-zero least-significant bits corresponding to the number DNUMTXCK. In some embodiments, the DCC circuitry 300 may be bypassed by writing 1 into a DCC_BPS_SELECT register of block 320 and selecting bypassing input to the multiplexer 327. The DCC_BPS_SELECT register may have a default state set as 0.

Block 320 communicates with the interface block 330, which implements an off-chip communications protocol and the physical layer. The interface block 330, in turn, communicates with the processor block 340. The processor block 340 includes a conventional central processing unit, memory, and control registers, and may be implemented on a chip integrating various parts of the DCC circuitry 300 or off the chip as an external device.

In the second operation of duty cycle programming sequence, the lower M bits of the TDC 302 output TDCOUT are written into the register block 320 as signal DELLENGTH, and are forwarded to the processor block 340 via the interface 330. The processor block 340 is a priori provided with information about the desired duty cycle value (DCTARGET), which it stores in an internal memory device. Based on that stored value and the information provided by signal DELLLENGTH, the processor block 340 computes the required number of delay elements to generate signal DELAYED_REF. This signal, in turn, is used to generate the output signal DCC_OUT with the target duty cycle by performing logic AND operation on the signals DELAYED_REF and UNDELAYED_REF. The required number of delay elements is binary-encoded and written to the register block 320 as the signal SELDELAY of length S via interface 330. The multiplexer 325 then decodes binary signal SELDELAY and selects the output of the appropriate delay line element to generate signal DELAYED_REF. The output DCC_OUT of the multiplexer 325 is TXRF_OUT, the carrier signal of the DCC controller 300 with the target duty cycle value. The DCC controller 300 produces the TXRF_OUT carrier signal with duty cycle that is greater than zero and less than or equal to 50%. For applications where lower jitter and low phase noise are required, a "clean" 50% or 25% duty cycle waveform is obtained by bypassing DDL and AND gate 328 by writing 1 in register DCC_BPS_SELECT as shown in FIG. 3B.

In various embodiments, for a target duty cycle having a value between 0% and 25%, signal SDCC is driven HIGH to select one of the 25% duty cycle quadrature phases to propagate to the output of the multiplexer 315, DDL 304, multiplexer 325 and AND gate 328. The number DNUMDCC of required selected delay elements of DDL for the DCTARGET value is expressed as:

$$DNUMDCC = \text{floor}\left(DNUMTXCK \cdot \left(1 - 4 \cdot \left(\frac{DCTARGET}{100}\right)\right)\right). \quad \text{Eq. (3)}$$

For a target duty cycle having a value between 25% and 50%, the signal DCC is driven LOW to select one of the 50% duty cycle quadrature phases to propagate to the output of the multiplexer 315, DDL 304, multiplexer 325 and AND gate 328. The corresponding computation for number DNUMDCC is expressed as:

$$DNUMDCC = \text{floor}\left(DNUMTXCK \cdot \left(1 - 4 \cdot \frac{DCTARGET - 0.25}{100}\right)\right). \quad \text{Eq. (4)}$$

FIG. 4 illustrates the TDC 302 and support circuitry in greater detail. Each delay element 305 in the DDL 304 may have one input and two outputs; delays from the input to any of the outputs may be matched. In one embodiment, one of the outputs is connected to the input of the successive delay element in the DDL chain 304 and to one of the inputs of the multiplexer 325 that is used to select one of the DLL outputs to generate a TX carrier signal having a desired duty cycle. The second output is directed to a D input of one of a chain of TDC flip-flops 403 that collectively provide the lower 24 bits of the output of the TDC 302. The flip-flops 403 are clocked on the rising edge of the signal CLKREFB that itself is an inverted copy of the signal UNDELAYED_REF. As such, each input of each of the flip-flops 403 is captured on the falling edge of signal UNDELAYED_REF. As the signal UNDELAYED_REF propagates through delay elements 305, it reaches the condition where a setup HIGH time violation will occur at some flip-flop, where all downstream flip-flops capturing outputs of delay elements 305 will capture logic value LOW and all upstream flip-flops flop will capture logic value HI. The captured logic values in all flip-flops 403 then form the digital signal TDCOUT of length N.

The minimally supported duty cycle may depend on the period of the TX carrier; that period, however, is generally limited by the shortest controlled pulse width for any operating condition. This limit is set by a mismatch in the signal paths of two PA drivers as well as any variation in propagation delays for the pull-up and pull-down drivers that reduce the accuracy of the DCC circuitry 300. This limitation thus results in reduced control over the range of the duty cycle at a lower TX carrier frequency. Accordingly, while the duty cycle control is optimal for the NMR application (or any suitable application), implementing this feature may result in either reduced accuracy in determining the desired duty cycle of the TX carrier at higher frequencies or a reduced control range of the duty cycle at lower frequencies. This can be mitigated by choosing a smaller unit delay Td and/or a larger number of DDL delay elements N.

In various embodiments, a smaller amount of power may be required for excitation of a sample at a lower TX carrier frequency. The availability of the low-power mode with a 25% duty cycle and below the control range may address this requirement. At a higher frequency, more power is required and a TX carrier having a 50% duty cycle is used almost exclusively.

In sum, embodiments of the present invention provide an all-digital, on-chip duty-cycle control mechanism for accurately setting the duty cycle of PA switching waveforms; this ensures power control with predictable accuracy.

The central processing unit of the processor block 340 may be a general-purpose processor, but may instead utilize any of a wide variety of other technologies including special-purpose hardware, a microcomputer, minicomputer, mainframe computer, programmed microprocessor, microcontroller, peripheral integrated circuit element, a CSIC (customer-specific integrated circuit), ASIC (application-specific integrated circuit), a logic circuit, a digital signal processor, a programmable logic device such as an FPGA (field-programmable gate array), PLD (programmable logic device), PLA (programmable logic array), RFID processor, smart chip, or any other device or arrangement of devices that is capable of implementing the steps of the processes of the invention.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. Circuitry for adjusting a duty cycle of an RF carrier input signal to a power amplifier (PA), the circuitry comprising:
 a digital delay line, comprising a plurality of digital delay elements, for receiving the input signal;
 a time-to-digital converter for measuring a number of the digital delay elements required for generating a desired duty cycle;
 circuitry for selecting the number of delay elements of the digital delay line required to generate a desired duty cycle and receiving an output signal therefrom, the output signal having the adjusted duty cycle; and
 a processor having a control register for enabling a HIGH-power mode or a LOW-power mode of the circuitry,
 wherein the control register selects the HIGH-power mode when the desired duty cycle has a value between 25% and 50% and the LOW-power mode when the desired duty cycle has a value between 5% and 25%.

2. The circuitry of claim 1, wherein the control register has a value of 1 for enabling the LOW-power mode and a value of 0 for enabling the HIGH-power mode.

3. The circuitry of claim 1, further comprising a processor having a register for bypassing the digital delay line.

4. The circuitry of claim 1, wherein the digital delay line comprises a plurality of delay elements.

5. The circuitry of claim 1, wherein each one of the delay elements comprises one input and three outputs.

6. The circuitry of claim 1, further comprising a processor configured to determine the number of the delay elements required for generating the desired duty cycle based on a measurement of the time-to-digital converter.

7. The circuitry of claim 6, wherein the processor is implemented on a chip integrating the digital delay line and time-to-digital converter.

8. The circuitry of claim 6, wherein the processor is implemented off a chip integrating the digital delay line and time-to-digital converter and the circuitry further comprises a communication module for allowing signal communication between the processor and the chip.

9. Circuitry for adjusting a duty cycle of an RF carrier input signal to a power amplifier (PA), the circuitry comprising:
 a digital delay line, comprising a plurality of digital delay elements, for receiving the input signal;
 a time-to-digital converter for measuring a number of the digital delay elements required for generating a desired duty cycle; and
 circuitry for selecting the number of delay elements of the digital delay line required to generate a desired duty cycle and receiving an output signal therefrom, the output signal having the adjusted duty cycle,
 wherein each one of the delay elements comprises one input and three outputs; a first one of the outputs is coupled to an input of a successive delay element; a second one of the outputs is coupled to an input of a multiplexer; and a third one of the outputs is coupled to an input of the time-to-digital converter.

10. The circuitry of claim 9, wherein the digital delay line comprises a plurality of delay elements, the circuitry further comprising a processor having a register for bypassing the digital delay line.

11. The circuitry of claim 9, further comprising a processor configured to determine the number of the delay elements required for generating the desired duty cycle based on a measurement of the time-to-digital converter.

12. The circuitry of claim 11, wherein the processor is implemented on a chip integrating the digital delay line and time-to-digital converter.

13. The circuitry of claim 11, wherein the processor is implemented off a chip integrating the digital delay line and time-to-digital converter and the circuitry further comprises a communication module for allowing signal communication between the processor and the chip.

14. An NMR apparatus comprising:
 an NMR coil configured to enclose a sample;
 an integrated switch-mode PA coupled to the NMR coil; and
 circuitry for adjusting a duty cycle of an input signal to a power amplifier (PA);
 wherein the circuitry comprises: (i) a digital delay line having a plurality of delay elements, (ii) a time-to-digital converter for measuring a number of the delay elements required for generating a desired duty cycle, and (iii) a processor having a control register for enabling a HIGH-power mode or a LOW-power mode of the circuitry,
 wherein the control register selects the HIGH-power mode when the desired duty cycle has a value between 25% and 50% and the LOW-power mode when the desired duty cycle has a value between 5% and 25%.

15. The NMR apparatus of claim 14, wherein the control register has a value of 1 for enabling the LOW-power mode and a value of 0 for enabling the HIGH-power mode.

16. The NMR apparatus of claim 14, wherein the circuitry further comprises a processor having a register for bypassing the digital delay line.

17. The NMR apparatus of claim 14, wherein the digital delay line comprises a plurality of delay elements.

18. The NMR apparatus of claim 14, wherein each one of the delay elements comprises one input and three outputs.

19. The NMR apparatus of claim 14, wherein the circuitry further comprises a processor configured to determine the number of the delay elements required for generating the desired duty cycle based on a measurement of the time-to-digital converter.

20. The NMR apparatus of claim 19, wherein the processor is implemented on a chip integrating the digital delay line and time-to-digital converter.

21. The NMR apparatus of claim 19, wherein the processor is implemented off a chip integrating the digital delay line and time-to-digital converter and the circuitry further comprises a communication module for allowing signal communication between the processor and the chip.

22. An NMR apparatus comprising:
 an NMR coil configured to enclose a sample;

an integrated switch-mode PA coupled to the NMR coil; and circuitry for adjusting a duty cycle of an input signal to a power amplifier (PA), wherein the circuitry comprises: (i) a digital delay line having a plurality of delay elements, and (ii) a time-to-digital converter for measuring a number of the delay elements required for generating a desired duty cycle, and further wherein each one of the delay elements comprises one input and three outputs; a first one of the outputs is coupled to an input of a successive delay element; a second one of the outputs is coupled to an input of a multiplexer; and a third one of the outputs is coupled to an input of the time-to-digital converter.

23. The NMR apparatus of claim 22, wherein the digital delay line comprises a plurality of delay elements and the circuitry further comprises a processor having a register for bypassing the digital delay line.

24. The NMR apparatus of claim 22, wherein the circuitry further comprises a processor configured to determine the number of the delay elements required for generating the desired duty cycle based on a measurement of the time-to-digital converter.

25. The NMR apparatus of claim 24, wherein the processor is implemented on a chip integrating the digital delay line and time-to-digital converter.

26. The NMR apparatus of claim 24, wherein the processor is implemented off a chip integrating the digital delay line and time-to-digital converter and the circuitry further comprises a communication module for allowing signal communication between the processor and the chip.

* * * * *